(12) United States Patent
Pfeuffer et al.

(10) Patent No.: US 9,274,195 B2
(45) Date of Patent: Mar. 1, 2016

(54) DETERMINATION OF A MAGNETIC RESONANCE SYSTEM CONTROL SEQUENCE

(71) Applicants: Josef Pfeuffer, Kunreuth (DE); Rainer Schneider, Hoechstadt (DE)

(72) Inventors: Josef Pfeuffer, Kunreuth (DE); Rainer Schneider, Hoechstadt (DE)

(73) Assignee: Siemens Aktiengesellschaft, Munich (DE)

( * ) Notice: Subject to any disclaimer, the term of this patent is extended or adjusted under 35 U.S.C. 154(b) by 432 days.

(21) Appl. No.: 13/847,680

(22) Filed: Mar. 20, 2013

(65) Prior Publication Data

US 2013/0249549 A1    Sep. 26, 2013

(30) Foreign Application Priority Data

Mar. 20, 2012 (DE) .......................... 10 2012 204 401
Jul. 16, 2012 (DE) .......................... 10 2012 212 402

(51) Int. Cl.

| | |
|---|---|
| *G01V 3/00* | (2006.01) |
| *G01R 33/54* | (2006.01) |
| *G01R 33/28* | (2006.01) |
| *G01R 33/483* | (2006.01) |
| *G01R 33/561* | (2006.01) |

(52) U.S. Cl.
CPC .............. *G01R 33/543* (2013.01); *G01R 33/28* (2013.01); *G01R 33/4833* (2013.01); *G01R 33/4836* (2013.01); *G01R 33/5612* (2013.01)

(58) Field of Classification Search
CPC ................................................. G01R 33/4818
USPC .................................. 324/314, 309, 307, 306
See application file for complete search history.

(56) References Cited

U.S. PATENT DOCUMENTS

| | | | |
|---|---|---|---|
| 5,275,165 A | 1/1994 | Ettinger et al. | |
| 7,123,010 B2 | 10/2006 | Krockel | |
| 8,542,013 B2 * | 9/2013 | Möβnang et al. | ............. 324/309 |
| 2011/0241680 A1 | 10/2011 | Mossnang et al. | |
| 2012/0019247 A1 * | 1/2012 | Boernert et al. | ............. 324/309 |

(Continued)

FOREIGN PATENT DOCUMENTS

| | | |
|---|---|---|
| CN | 101975936 A | 2/2011 |
| EP | 2 378 307 A1 | 10/2011 |
| JP | 2008307303 A | 12/2008 |

OTHER PUBLICATIONS

Schröder et al., "Spatial Excitation Using Variable-Density Spiral Trajectories," Journal of Magnetic Resonance Imaging, vol. 18 (2003), pp. 136-141.

(Continued)

*Primary Examiner* — Louis Arana
(74) *Attorney, Agent, or Firm* — Schiff Hardin LLP

(57) ABSTRACT

In method and a control sequence determination device to determine a magnetic resonance system control sequence that includes at least one radio-frequency pulse train to be emitted by a magnetic resonance system, a target magnetization (m) is initially detected, and an energy distribution function in k-space is determined on the basis of the target magnetization. A k-space trajectory is then determined under consideration of the energy distribution function in k-space, for which the radio-frequency pulse train is then determined in an RF pulse optimization method. The method is suitable for operation of a magnetic resonance system, and a magnetic resonance system includes such a control sequence determination device.

14 Claims, 11 Drawing Sheets

(56) References Cited

U.S. PATENT DOCUMENTS

2013/0253876 A1* 9/2013 Pfeuffer et al. ............... 702/123
2014/0292333 A1* 10/2014 Beck et al. ................... 324/309

OTHER PUBLICATIONS

Chao et al., "Joint Design of Spoke Trajectories and RF Pulses for Parallel Excitation," Magnetic Resonance in Medicine, vol. 65 (2011), pp. 973-985.

Setsompop et al., "Magnitude Least Squares Optimization for Parallel Radio Frequency Excitation Design Demonstrated at 7 Tesla With Eight Channels," Magnetic Resonance in Medicine, vol. 59 (2008), pp. 908-915.

Yinan et al., "Reducing SAR in parallel excitation using variable-density spirals: a simulation-based study," Magnetic Resonance Imaging, vol. 26 (2008), pp. 1122-1132.

Lee et al., "Time-Optimal Design for Multidimensional and Parallel Transmit Variable-Rate Selective Excitation," Magnetic Resonance in Medicine, vol. 61 (2009), pp. 1471-1479.

Ritter, "pTX—Pulse Design Suite," Siemens Healthcare, MR Physics Group (2011).

Hargreaves, "Time-Optimal Multidimensional Gradient Waveform Design for Rapid Imaging," Magnetic Resonance in Medicine, vol. 51 (2004), pp. 81-92.

Yoon et al., "A fast parallel excitation pulse design for efficient selection and ordering of PE locations with B0 field inhomogeneity," Proc. Intl. Soc. Mag. Reson. Med., vol. 19 (2011), p. 2902.

Tsai et al., "Reduced Aliasing Artifacts Using Variable-Density k-Space Sampling Trajectories," Magnetic Resonance in Medicine, vol. 43 (2000), pp. 452-458.

Schneider et al., "Target Pattern Driven Trajectory Design," Siemens AG (2012).

Grissom et al., "Spatial Domain Method for the Design of RF Pulses in Multicoil Parallel Excitation," Magnetic Resonance in Medicine, vol. 56 (2006), pp. 620-629.

Jankiewicz et al., "Practical considerations for the design of sparse-spokes pulses," Journal of Magnetic Resonance, vol. 203 (2010), pp. 294-304.

* cited by examiner

DETERMINATION OF A MAGNETIC RESONANCE SYSTEM CONTROL SEQUENCE

BACKGROUND OF THE INVENTION

1. Field of the Invention

The invention concerns a method and a control sequence determination device to determine a magnetic resonance system control sequence. Moreover, the invention concerns a method to operate a magnetic resonance system using such a magnetic resonance system control sequence; as well as a magnetic resonance system with a radio-frequency transmission device, with a gradient system and a control device that is designed in order to emit a radio-frequency pulse train to implement a desired measurement on the basis of a predetermined control sequence, and to emit a gradient pulse train in coordination therewith via the gradient system.

2. Description of the Prior Art

In a magnetic resonance tomography system (shortened to "magnetic resonance system"), the body to be examined is typically exposed to a relatively high basic magnetic field (known as the $B_0$ field)—for example of 3 or 7 Tesla—produced by a basic field magnet system. A magnetic field gradient is superimposed on the basic magnetic field with a gradient system. Radio-frequency excitation signals (RF signals) are then emitted by a radio-frequency transmission system with suitable antenna devices, which leads to the nuclear spins of specific atoms or molecules of an examination subject being excited to resonance by this radio-frequency field so as to be flipped by a defined flip angle relative to the magnetic field lines of the basic magnetic field. This radio-frequency excitation, and the resulting flip angle distribution, is designated in the following as a nuclear magnetization, or "magnetization" for short. Upon relaxation of the nuclear spins, radio-frequency signals (known as magnetic resonance signals) are radiated by the spine that are received by suitable reception antennas, and then are processed further. Finally, the desired image data can be reconstructed from the raw data acquired in such a manner. The emission of the radio-frequency signals (known as the $B_1$ field) for nuclear spin magnetization most often takes place using an antenna known as a "whole-body coil" (or "full-body coil") that is permanently arranged around the measurement space (patient tunnel) in the apparatus. Reception of the magnetic resonance signals most often takes place, however, using reception coils known as local coils that are positioned closer to the body of the patient. In principle, however, a reception of magnetic resonance signals can take place with the whole-body coil and/or transmission of the RF signals can take place with the local coils.

A control sequence with a radio-frequency pulse train that is to be emitted and a gradient pulse train that is to be switched in coordination therewith (with matching gradient pulses in the slice-selection direction, in the phase coding direction and in the readout direction, frequently in the z-direction, y-direction and z-direction), as well as additional control specifications, is defined for a defined measurement (data acquisition procedure) in a specification that is known as a measurement protocol. This measurement protocol can be created in advance and can be retrieved (for example from a memory) for a defined measurement, and may possibly be modified by the operator on site. During the measurement, the control of the magnetic resonance system then takes place wholly automatically on the basis of this control sequence, with the control device of the magnetic resonance system reading out and executing the commands from the measurement protocol.

In order, to generate the control sequence, it is typical for the individual RF pulse trains (i.e. the RF trajectories) for the individual transmission channels are determined over time in an optimization method, depending on a fixed "k-space trajectory" that is typically provided by a measurement protocol or individually by an operator. In order to implement such a "transmission k-space trajectory" (called only "k-space trajectory" or "trajectory" for short in the following), locations for entry of raw data in k-space that are selected in the desired order by adjusting the individual gradients at specific times. K-space is the partial frequency domain, and the trajectory in k-space describes the path in k-space that is traversed over time upon emission of an RF pulse by the aforementioned switching of the gradient pulses. By adjusting the k-space trajectory, it can be determined at which spatial frequencies specific amounts of the RF energy are applied (effective).

Additional, currently measured $B_1$ maps that respectively indicate the spatial $B_1$ field distribution for a specific antenna element, and a $B_0$ map that represents the off-resonances or deviation of the $B_0$ field from the actual desired, homogeneous $B_0$ field (i.e. the actually sought Larmor frequency), with spatial resolution, can be taken into account in the optimization method to generate the control sequences. Moreover, for the planning of the RF pulse series the user often provides a target magnetization, for example a desired flip angle distribution. The RF pulse series that is necessary to achieve entered requirements is then calculated with a suitable RF pulse optimization program so that the target magnetization is achieved. In many cases, this is an optimally homogeneous magnetization in the desired field of view (FoV) that is to be examined, or the desired region to be excited (FoE—Field of Excitation).

In more recent methods it is possible to also selectively excite entire defined regions (for example two-dimensional regions) within a slice, meaning that a non-homogeneous target magnetization is deliberately sought.

One possibility to determine a two-dimensional radio-frequency pulse sequence (known as a "2DRF pulse") in the previously described manner is described in the article, "Magnitude Least Square Optimization for Parallel Radio Frequency Excitation Design Demonstrated at 7 Tesla With Eight Channels" by K. Setsompop et al., Magn. Reson. Med. 59: 908 through 915, 2008. The transverse target magnetization is represented in a linear matrix equation system from the spatial coil profiles and the multichannel radio-frequency pulse series, into which information can also be entered about the present $B_0$ maps and $B_1$ maps and the k-space trajectory that is used. This equation system is then numerically solved for a specific, predetermined radio-frequency pulse series. Examples of such radio-frequency pulse series with selective excitation are echoplanar or spiral trajectories.

Such one-dimensional, two-dimensional or multidimensional k-space trajectories for a selective excitation have a higher complexity in relation to the typically used trajectories with constant gradients that are used for a simple, slice-selective excitation. Due to this higher complexity, a higher risk of artifact formation in the images also exists, for example because such pulses can already be significantly longer. Furthermore, an increased risk exists that hardware radio-frequency limitations and/or limitations with regard to the radio-frequency exposure of the patients (for example limitation of the SAR=Specific Absorption Rate or of the SED=Specific Energy Density) are exceeded. This is particularly the case for trajectories that are presently used most often, with equidistant curves of adjacent tracks (for example spiral trajectories) whose spiral revolutions proceed with a constant pitch, or rectilinear trajectories (for example EPI trajectories) with equally spaced, straight-line neighboring tracks running in parallel.

However, exceeding maximum allowable voltage peaks or radio-frequency power limits can lead to damage to the device hardware, or to the situation that radio-frequency pulses are limited later in the measurement on the basis of safety checks (in particular are reduced in power), which then in turn leads to unsatisfactory excitation results and consequently worse image data. For this reason, complicated k-space trajectories are calculated automatically within the scope of optimization methods, with maximum allowed powers, SAR and/or SED limit conditions, etc. are also being taken into account in the optimization methods. However, such calculations are very complex and time-consuming, and the results are sometimes unsatisfactory or unstable.

SUMMARY OF THE INVENTION

An object of the present invention is to provide an improved method to determine a magnetic resonance system control sequence and a corresponding control sequence determination device in order to implement very fast and optimally robust calculations of optimized k-space trajectories.

In the method according to the invention, a desired target magnetization is initially registered. According to the invention, a computerized determination (for example a direct calculation) of an energy distribution function subsequently takes place in k-space on the basis of the target magnetization. This energy distribution function reflects the relative amount of energy depending on the respective location in k-space. This energy distribution function can inasmuch also be designated as a spatial "energy density function" since it specifies how much energy would ultimately, approximately be required per k-space region in order to optimally achieve the target magnetization.

In a further step, a k-space trajectory is then determined under consideration of the energy distribution function in k-space. It can then directly be achieved that, the higher the energy or energy density at a location in k-space, the more densely the trajectory is made to proceed so that the high energy consumption in k-space that is required is accordingly optimally introduced efficiently at these locations. As used herein, the k-space trajectory density means how closely different trajectory crossings are situated relative to one another in k-space, for example: how densely two adjacent lines running in parallel are (given an EPI trajectory with straight-line (rectilinear) tracks), or how closely the trajectory passes to itself from one revolution to the next revolution (given a spiral trajectory (i.e. the pitch between two revolutions that exists at a respective location), or how close the angle is between two spokes given a radial trajectory.

The determination of the radio-frequency pulse train then subsequently takes place for the k-space trajectory in an RF pulse optimization method, for example again on the basis of the predetermined target magnetization on the basis of predetermined $B_1$ maps etc. The determination of the radio-frequency pulse train can take place as in the conventional methods, in which the k-space trajectory is identically hard-set at the beginning.

An important feature of the method according to the invention is that an energy distribution function is directly calculated from the target magnetization, with which energy distribution function the target magnetization can be achieved. The k-space trajectory thus can be deterministically set in order to achieve an energy distribution in k-space that leads in the best possible manner to the desired target magnetization. This means that the conventional trajectory design is replaced by a new metric in order to determine a transmission k-space trajectory whose density is adapted—i.e. is tailored—specifically to the application. Therefore, no minimization procedure or iterative method based in residual errors, etc. is necessary; rather, instead of this a deterministic metric and analytical or numerical calculation is used. Moreover, additional boundary conditions or regularized optimization methods are not absolutely necessary in the determination of the radio-frequency pulse train since the main problems are already taken into account before the radio-frequency pulse optimization (namely in the determination of a suitable k-space trajectory). The metric for calculation of the variable k-space trajectory density thus primarily includes the information about the spatial target magnetization.

The method according to the invention is thus particularly fast with regard to the calculations it requires, and is additionally particularly robust. This consequently leads to an overall speed advantage and to compliance with the radio-frequency limitations, and in particular to a reduced radio-frequency exposure given a maintained or better image quality in the overall measurement.

A control sequence determination device in accordance with the invention includes an input interface arrangement to register a target magnetization. This can be an arrangement having multiple different interfaces that, for example, registers not only the target magnetization but also additional information, for example a desired, predetermined k-space trajectory type; a current $B_0$ map; current $B_1$ maps etc. It can likewise be a combined interface that is able to accept multiple data types. A registration of the data can also include an acceptance of data from other components of the magnetic resonance system, for example a user interface or from a memory unit with a database, etc., or an acceptance from a measurement device or reconstruction device of the magnetic resonance system.

The input interface arrangement can accordingly be, for example, a user interface for manual input of the target magnetization (and possibly a k-space trajectory type), in particular even a graphical user interface. However, it can also be an interface in order to select and accept data from a data memory arranged within the control sequence determination device or connected with this via a network (possibly also using the user interface).

Furthermore, the control sequence determination device requires an energy distribution determination unit to determine the energy distribution function in k-space on the basis of the target magnetization, as well as a trajectory determination unit to determine a k-space trajectory under consideration of the energy distribution function in k-space.

Finally, an RF pulse optimization unit is required to determine the radio-frequency pulse train for the k-space trajectory. Moreover, the control sequence determination device should have a suitable control sequence output interface in order to pass the control sequence to other control units of the magnetic resonance tomography system. The control sequence output interface can be, for example, an interface that transmits the control sequence to a magnetic resonance controller in order to directly control the measurement with the control sequence, but also an interface that sends the data over a network and/or stores said data in a memory for later use.

In a method according to the invention for operation of a magnetic resonance system, a control sequence is determined according to the previously described method, and the magnetic resonance system is then operated using this control sequence. A magnetic resonance system of the aforementioned type according to the invention has a previously described control sequence determination device.

Significant portions of the control sequence determination device can be designed in the form of software components. This in particular concerns the energy distribution determination unit, the trajectory determination unit and the RF pulse optimization unit. The cited interfaces can likewise be designed at least in part in the form of software, and possibly access hardware interfaces of a present computer. The invention thus also comprises a computer program which can be loaded directly into a memory of a control sequence determination device, with program code segments in order to execute all steps of the method according to the invention when the program is executed in a control sequence determination device. Such realization in software has the advantage that even previous devices that are used to determine control sequences (for example suitable computers in computer centers of the magnetic resonance system manufacturer) can be modified via implementation of the program in a suitable manner in order to determine fast and robustly optimized control sequences in the manner according to the invention.

A relatively fast determination of an energy distribution function in k-space is possible on the basis of the target magnetization, initially in that a Fourier transformation of the target magnetization from position space into k-space is implemented. This Fourier transformation can take place in two dimensions, i.e. for every single slice in positional space, but also three-dimensionally for a three-dimensional volume in positional space. A fast Fourier transformation is hereby advantageously used.

The determination of the energy distribution function in k-space particularly preferably takes place on the basis of a mean-exempt target magnetization. "Mean-exempt" means that the mean value for the entire slice or, respectively, in the entire volume to be transformed is respectively subtracted from the target magnetization data (i.e. the spatially dependent magnetization or flip angle values). This mean-exempt target magnetization can then advantageously be translated into k-space with a Fourier transformation as previously described in order to obtain the energy distribution function. The use of the mean-exempt target magnetization has the advantage that the normally very high peak in the k-space center is masked out, or at least is strongly reduced. Radio-frequency details can be detected better in this way.

In particularly preferred variants of the invention, the energy distribution function is initially modified in k-space, and the determination of the k-space trajectory then takes place under consideration of this modified energy distribution function. There are various possibilities for a modification. For example, the energy distribution function could be scaled and/or distorted in order to achieve specific effects.

The energy distribution function in k-space is preferably segmented or divided into spatial segments with regard to k-space. In the individual spatial segments, the energy distribution function can then be modified differently, i.e. scaled or weighted, distorted, etc.

In a particularly suitable possibility, extreme values of the energy distribution function are used in order to implement a segmentation of the energy distribution function. For example, the segmentation can take place such that precisely one maximum (local maximum with regard to k-space) is present in each segment. For example, the separation of the individual segments can then take place at minima (local minima in k-space). Such a segmentation can be implemented very simply, initially in that the extreme values of the energy distribution function are sought in k-space and the division of the segments respectively takes place accordingly at the minima between two maxima. In principle, it would naturally also be possible to implement a segmentation so that the segment limits travel to the minima and one minimum is present per segment, for example.

The energy distribution function is advantageously scaled for modification in k-space with a weighting function. This ensures that ranges in high frequencies are also not too strongly underrepresented, since the energy distribution function is typically strongly reduced at high energies in relation to the low frequencies. This is preferably a predetermined window function independent on a $B_0$ distribution and/or current $B_1$ maps that declines outward from a maximum in the k-space center. A particularly preferred energy distribution function is a Hanning window function. Additional preferred weighting functions are Gaussian functions, Hemming functions or other functions that (for example) offer an optimal compromise between energy expenditure and spatial resolution.

Insofar as a segmentation of the energy distribution function has taken place, the energy distribution function in k-space can especially preferably be respectively scaled in the individual spatial segments with a value of the weighting function that is associated with the appertaining spatial segment. For example, a specific spatial segment of the energy distribution function can thus respectively be scaled with the value which the weighting function has at the location of the maximum of the appertaining spatial segment.

Particularly when an energy distribution function is weighted in segments—i.e. is weighted differently in individual spatial segments—an advantage is achieved when the separation of the spatial segments or, respectively, segments takes place at the minima of the energy distribution function, since an adaptation should take place at the boundaries between the segments after the weighting, again in order to achieve a smooth energy distribution function without stages at the respective segment sections. However, such a smoothing does not turn out to be as much at the minima as at the maxima, because these minima are already the points in k-space at which an undersampling takes place later since the k-space trajectory is determined under consideration of the energy distribution function, and consequently the k-space trajectory is not so densely situated at points of the energy minima as at the maxima.

A smoothing between two segments can take place with a known moving average method or with a different low-pass filter.

In order to reduce the cost in the determination of the energy distribution function in k-space, the dimension of the energy distribution function in k-space can advantageously be reduced. A preferred possibility is to translate the energy distribution function (that normally exists in Cartesian coordinates in k-space after the Fourier transformation) into polar coordinates by means of a polar coordinate transformation. A maximum projection can subsequently be implemented. These two steps are a rotation-invariant reduction of the dimension of the energy distribution function. For example, if the energy distribution function is initially defined in two-dimensional k-space (i.e. planar), a translation into polar coordinates with regard to the radius and the angle can initially take place, and a reduction in the radius can subsequently take place via maximum projection. This in particular makes sense given a search for ideal spiral trajectories, since here it is primarily a density of the trajectories in the radial direction that is to be determined. A reduction in the angle as a remaining polar coordinate can be achieved in a similar manner, for example in order to implement the energy distribution function depending on the angle for definition of radial trajectories whose spatial density depends on the angle between two spokes.

The radio-frequency pulses are classically emitted via only one transmission channel and are then suitably fed into the whole-body coil. For example, it is hereby possible to separate the radio-frequency signal and to feed the partial signals—amplitude- and phase-shifted by 90° counter to one another and correspondingly spatially offset—into a whole-body coil constructed in the form of a birdcage antenna, such that a circularly polarized (phase only) or elliptically polarized (amplitude and phase) $B_1$ field is then emitted which is homogenous in the optimal case.

In newer magnetic resonance systems it has become possible to populate the individual transmission channels (for example the individual rods) of a cage antenna with individual RF signals adapted for imaging. For this purpose, a multichannel pulse is emitted that comprises multiple individual radio-frequency pulse trains that can be emitted in parallel via the different independent radio-frequency transmission channels. Such a multichannel pulse train (also designated as a "pTX pulse" due to the parallel emission of the individual pulses) can be used as an excitation, refocusing and/or inversion pulse. A method to develop such multichannel pulse trains in parallel excitation methods is described in W. Grissom et al.: "Spatial Domain Method for the Design of RF Pulses in Multicoil Parallel Excitation", Mag. Res. Med. 56, 620-629, 2006.

The method according to the invention offers particular advantages within the scope of such pTX methods, advantageously such that the method is also used so that the magnetic resonance system control sequence created according to the invention comprises a multichannel pulse train with multiple individual RF pulse trains that are to be emitted in parallel by the magnetic resonance tomography system via different independent radio-frequency transmission channels. The determination of the multichannel pulse train then also particularly preferably takes place on the basis of $B_1$ maps that respectively indicate the distribution of the $B_1$ field for the individual transmission channels.

In principle, however, the method can also be used very well in connection with classical methods and systems with one transmission channel, wherein the current $B_1$ map is also not additionally measured as necessary, but rather exists via assumption or, respectively, modeling. The method can also likewise be used within the scope of what is known as "$B_1$ shimming" with dynamic pulses (for example spokes), in which a predetermined base radio-frequency pulse is fed into various transmission channels with adjustable different amplitude weightings and phase shifts of the respective scope, for example in order to thus achieve a homogenization of the $B_1$ field.

On the basis of the determined energy distribution function, it is also possible to automatically determine the ideal k-space trajectory type. The type of k-space trajectory is indicated with such a k-space trajectory type, for example whether it is a spiral trajectory, a straight-line trajectory for an EPI (echoplanar imaging) sequence, what is known as radial trajectories with concentrically rotated spokes etc. Only the basic type is initially indicated with this. Additional parameters are then determined within the scope of the method according to the invention in order to obtain an optimal trajectory of the determined trajectory type, for example the locally different slope of a spiral trajectory or the spacing between adjacent tracks of an EPI trajectory. However, a desired k-space trajectory type can alternatively be registered (for example at the beginning), for example by acceptance from a measurement protocol or from a user interface into which an operator inputs the k-space trajectory type.

The method according to the invention for determination of the k-space trajectory can also be combined with other methods.

As explained above, in principle the energy distribution function is initially calculated in k-space only on the basis of the target magnetization. However, a calculation of the energy distribution function can additionally also take place on the basis of a $B_0$ map so that the frequency deviations—i.e. the off-resonances—caused by the inhomogeneity of the $B_0$ field are automatically also taken into account in the energy distribution function.

For example, a calculation of an error density in k-space can additionally take place on the basis of the current $B_0$ map and/or on the basis of the target magnetization by means of an analytical function or error metric. This analytical function defines the error density in k-space depending on the current $B_0$ map and/or the target magnetization. An "error metric" means a quantitative, functional relationship between the k-space error density and the $B_0$ map or the target magnetization. In other words: this error metric includes a given analytical connection between the $B_0$ map or, respectively, the target magnetization and the desired k-space error density.

Under consideration of this error density, the k-space trajectory determined in k-space with the aforementioned method on the basis of the energy distribution function can then be optimized even further, for example via an analytical calculation. For example, the k-space trajectory according to the invention can hereby advantageously be modified so that the trajectory density is optimally low in the possible regions in which the error in k-space is particularly severe (what are known as the "error hot spots"), meaning that the points in k-space with the most severe $B_0$ inhomogeneity effects are avoided, for example.

For example, a method to determine an optimized k-space trajectory of a specific trajectory type on the basis of the error density is described in DE 102012212376.8, the content of which is herein.

The method according to the invention for determination of the k-space trajectory can likewise also be combined with additional known methods.

The k-space trajectory is particularly preferably determined so that k-space is undersampled given an activation of the magnetic resonance system with the aid of the created magnetic resonance control sequence. This is in particular reasonable when a pTX system is used, since an acceleration of the excitation (and thereby the measurement) is then possible via clever undersampling and simultaneous use of the parallel transmission method.

For example, in a preferred variant k-space can be undersampled at least per region in a regular pattern, for example with what is known as a TX-SENSE method (SENSE=sensitivity encoding). Transmission k-space is hereby undersampled at least per region in a regular pattern—for example uniformly by a defined factor (for example 2×, 3×, 4×)—and is thereby sent in parallel with a corresponding number of radio-frequency channels. In particular in this method, the use of information from the $B_1$ maps is reasonable and is advantageously subject to the condition that the $B_1$ maps of the various channels are orthogonal at least in part.

In a further, preferred embodiment, the undersampling of k-space takes place at least in regions in an irregular pattern and/or at random, which is possible in connection with what is known as a "compressed sensing" method, for example.

In order to be able to implement the various methods, the determination of the k-space trajectory preferably also takes place on the basis of at least additional examination-specific or, respectively, examination type-specific parameters and/or on the basis of apparatus-specific or, respectively, apparatus-type specific parameters. At least one of the following apparatus-specific parameters can be used:

The number of transmission channels is of interest, in particular when an undersampling should take place within the scope of the TX-SENSE method, for example.

Furthermore, the determination of the k-space trajectory can take place on the basis of the maximum gradient amplitude that can be achieved within the magnetic resonance tomography system and/or that is permissible, for example due to safety limits.

The determination of the k-space trajectory can likewise take place under consideration of the maximum achievable and/or permissible gradient slew rate (i.e. the rise or fall rate of a gradient pulse which can likewise be wearing for a patient).

In practice, the $B_0$ field distribution can dynamically change over time, for example due to instability of the apparatus and/or movements and physiology (for example breathing, heart beat) of the patient/test subject. Typical instability problems can hereby occur in the imaging and artifacts, in particular in functional imaging (fMRI) and in perfusion and diffusion imagings. Insofar as an additional $B_0$ map is used in the method according to the invention, a current $B_0$ map is particularly preferably re-acquired during a measurement (i.e. within the scope of a measurement session in which multiple exposures are typically produced, meaning that multiple measurement sequences are driven), and based on this a new k-space trajectory is determined for at least one subsequent magnetic resonance control sequence used in the measurement. For example, this can take place repeatedly in regular time intervals, or also in irregular intervals. A result-driven new measurement can likewise also take place, for example when this is detected via MR signals (internal) or with external sensors (for example movement sensor, magnetic field sensor).

The method according to invention can be used given arbitrary trajectory types, in particular and preferably with EPI trajectories or spiral geometries, but also with spoke position geometries, radial geometries or free-form geometries.

The calculation of the radio-frequency pulse train particularly preferably initially takes place for a lower target magnetization within the scope of the RF pulse optimization method. The multichannel pulse train that is thereby determined is subsequently scaled up to a final target magnetization, and possibly is post-corrected again. For this procedure, it is utilized that the magnetization response is still linear for small magnetizations, i.e. for low flip angles (in what is known as the "low flip range"); for example, the magnetization response is still linear between 0° and 5°. In this range, a calculation with an optimization method is therefore significantly simpler and faster. If the optimal multichannel pulse train is found for this range, an upscaling is possible in a subsequent step without additional measures. For example, if the calculation takes place in the low flip range for a flip angle of at maximum $\alpha=5°$, and the actual magnetization should take place with a flip angle $\alpha$ of at maximum 90°, the amplitude values of the RF pulses are multiplied with a factor 18 corresponding to the ratio of the flip angles. The errors that thereby possibly occur can subsequently be determined and corrected within the scope of a simulation.

Since—in addition to the optimization of the k-space trajectory according to the invention—a determination of an optimal radio-frequency pulse train can be implemented by means of conventional RF pulse optimization methods within the scope of the method, additional parameters can also be optimized, in particular with regard to a physical RF exposure value of the examination subject. For example, the parameters used for the RF pulse optimization, or also other system parameters (for example the maximum gradient strength or the edge time) can be further varied later within the scope of the optimization in order to thus also achieve optimized results with regard to the SAR or SED values.

DESCRIPTION OF THE PREFERRED EMBODIMENTS

Figure 1:
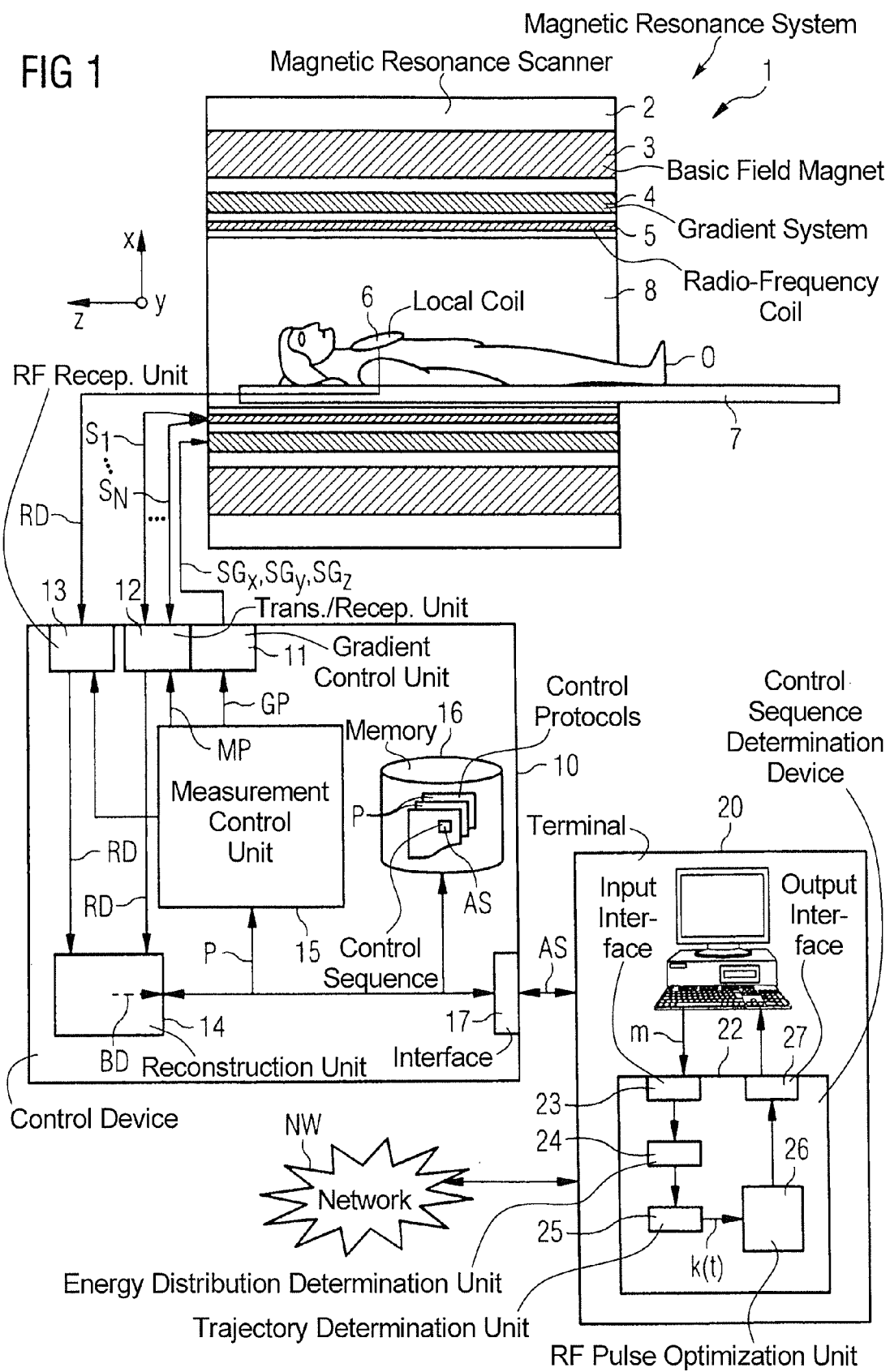
FIG. 1 schematically illustrates an exemplary embodiment of a magnetic resonance system according to the invention.

A magnetic resonance system 1 according to the invention is shown schematically in FIG. 1. The system 1 includes the actual magnetic resonance scanner 2 with an examination space 8 or patient tunnel that is located in the magnetic resonance scanner 2. A bed 7 can be driven into this patient tunnel 8, such that an examination subject O (patient/test subject) situated thereupon during an examination can be supported at a specific position within the magnetic resonance scanner 2 relative to the magnet system and radio-frequency system arranged therein, or can also be driven between different positions during a measurement.

Significant components of the magnetic resonance scanner 2 are a basic field magnet 3; a gradient system 4 with magnetic field gradient coils in order to apply arbitrary magnetic field gradients in the x-, y- and z-directions, and a whole-body radio-frequency coil 5. The receipt of magnetic resonance signals induced in the examination subject O can take place via the whole-body coil 5 with which the radio-frequency signals are normally emitted to induce the magnetic resonance signals. These signals are typically received, however, with local coils 6 placed on or below the examination subject O, for example. All of these components are fundamentally known to those skilled in the art and are therefore only schematically depicted in FIG. 1.

Here the whole-body radio-frequency coil 5 is designed in the form of a birdcage antenna and has a number N of individual antenna rods that run parallel to the patient tunnel 8 and are arranged uniformly distributed on a periphery around the patient tunnel 8. The individual antenna rods here can be controlled separately from a control device 10 as individual transmission channels $S_1, \ldots, S_N$, meaning that the magnetic resonance tomography system is a pTX-capable system. The method according to the invention can also be applied to classical magnetic resonance tomography apparatuses with only one transmission channel. However, since the method according to the invention offers particular advantages in pTX sequences, such an example is assumed in the following (without limitation of the generality) insofar as it is not noted otherwise.

The control device 10 can be a control computer that can be formed by multiple individual computers (that are possibly also spatially separate from one another and connected among one another by suitable cables or the like). This control device 10 is connected with a terminal 20 via a terminal interface 17, via which terminal interface 17 an operator can control the entire system 1. In the present case, this terminal 20 as a computer is equipped with keyboard; one or more monitors; and additional input devices (for example a mouse or the like), such that a graphical user interface is provided to the operator.

Among other things, the control device 10 has a gradient control unit 11 that can be composed of multiple sub-components. The individual gradient coils are connected via this gradient control unit 11 with control signals $SG_x$, $SG_y$, $SG_z$. These are gradient pulses that are placed at precisely provided time positions and with a precisely predetermined time curve during a measurement.

The control device 10, moreover, has a radio-frequency transmission/reception unit 12. This RF transmission/reception unit 12 likewise comprises multiple sub-components in order to respectively feed radio-frequency pulses separately and in parallel to the individual transmission channels $S_1, \ldots, S_N$ (i.e. to the individually controllable antenna rods of the body coil). Magnetic resonance signals can also be received via the transmission/reception unit 12. However, this typically occurs with the aid of the local coils 6. The raw data RD received with these local coils 6 are read out and processed by an RF reception unit 13. The magnetic resonance signals received from this or from the whole-body coil by means of the RF transmission/reception unit 12 are passed as raw data RD to a reconstruction unit 14 that reconstructs the image data BD from these and stores these in a memory 16 and/or passes these to the terminal 20 via the interface 17 so that the operator can observe them. The image data BD can also be stored and/or displayed and evaluated at other locations via a network NW. Insofar as the local coils have a suitable switching unit, these can also be connected to an RF transmission/reception unit in order to also use said local coils for transmission.

The gradient controller 11, the RF transmission/reception unit 12 and the reception unit 13 for the local coils 6 are respectively activated in coordination via a measurement control unit 15. Via corresponding commands, this ensures that a desired gradient pulse train GP is emitted via suitable gradient control signals $SG_x$, $SG_y$, $SG_z$ and controls the RF transmission/reception unit 12 in parallel so that a multichannel pulse train MP is emitted, meaning that the matching radio-frequency pulses are passed to the transmission rods of the whole-body coil 5 in parallel on the individual transmission channels $S_1, \ldots, S_N$. Moreover, it must be ensured that the magnetic resonance signals at the local coils 6 are read out at the matching point in time by the RF reception unit 13 or, respectively, that possible signals at the whole-body coil 5 are read out by the RF transmission/reception unit 12 and are processed further. The measurement control unit 15 provides the corresponding signals (in particular the multichannel pulse train MP) to the radio-frequency transmission/reception unit 12 and passes the gradient pulse train GP to the gradient control unit 11 according to a predetermined control protocol P. All control data that must be adjusted during a measurement are stored in this control protocol P.

A number of control protocols P for various measurements are typically stored in a memory 16. These could be selected and possibly varied by the operator via the terminal 20 in order to then provide a matching control protocol P for the currently desired measurement with which the measurement control unit 15 can operate. Moreover, the operator can also retrieve control protocols via a network NW—for example from a manufacturer of the magnetic resonance system—and then modify and use these as necessary.

However, the basic workflow of such a magnetic resonance measurement and the cited components for control are known to the man skilled in the art, such that they are not further addressed here in detail. Moreover, such a magnetic resonance scanner 2 as well as the associated control device can still have a number of additional components that are not explained in detail. At this point it is noted that the magnetic resonance scanner 2 can also be designed differently, for example with a laterally open patient space, and that in principle the radio-frequency whole-body coil does not need to be designed as a birdcage antenna.

Moreover, a control sequence determination device 22 according to the invention is schematically shown here in FIG. 1, which control sequence determination device serves to determine a magnetic resonance system control sequence AS. This magnetic resonance system control sequence AS includes (among other things) a pulse sequence with a gradient pulse train GP for a specific measurement in order to traverse a specific trajectory in k-space, as well as a radio-frequency pulse train coordinated with this (here a multichannel pulse train MP) to control the individual transmission channels $S_1, \ldots, S_N$. In the present case, the magnetic resonance system control sequence AS is created as part of the measurement protocol P.

The control sequence determination device 22 here is represented as part of the terminal 20 and can be realized in the form of software components at the computer of this terminal 20. In principle, however, the control sequence determination device 22 can also be part of the control device 10 itself, or be realized at a separate computer system, and the finished control sequences AS are transmitted via a network NW to the magnetic resonance system 1, possibly also within the scope of a complete control protocol P. When the control sequence determination device 22 is itself part of the control device 10 or is connected via a fast connection with the terminal 20 or a suitably fast computer with sufficient computing capacity, in a preferred case a current, new control sequence can also be determined during a measurement session (i.e. in the course of an examination of a patient) on the basis of current initial conditions (for example an updated $B_0$ map).

The control sequence determination device 22 here has an input interface 23. Via this input interface 23, the control sequence determination device 22 receives a target magnetization m that predetermines how the flip angle distribution should be in the desired measurement (possibly a $B_0$ map $\Delta B_0$) as well as possible, additional input parameters that are explained in detail later in connection with FIG. 2.

The data that are obtained in such a manner are then initially relayed to an energy distribution determination unit 24 which determines an energy distribution determination function in k-space in the manner explained in detail later. A subsequent trajectory determination unit 25 then determines an optimal k-space trajectory k(t) in k-space on the basis of this energy distribution determination function. An optimal radio-frequency pulse train MP can then be determined in an RF pulse optimization unit 26.

These data are then output again via a control sequence output interface 27 and can then be passed to the control device 10 within the scope of a control protocol P in which additional rules are specified to control the magnetic resonance system 1 (for example parameters regarding reconstruction of the images from the raw data). If the control sequence AS should be updated in the course of a measurement session, this can also be stored in the control protocol P, such that a new control sequence AS is automatically determined in the manner according to the invention or is requested from the terminal 20 or another computer by the control device 10 at the suitable points in time.

Figure 2:
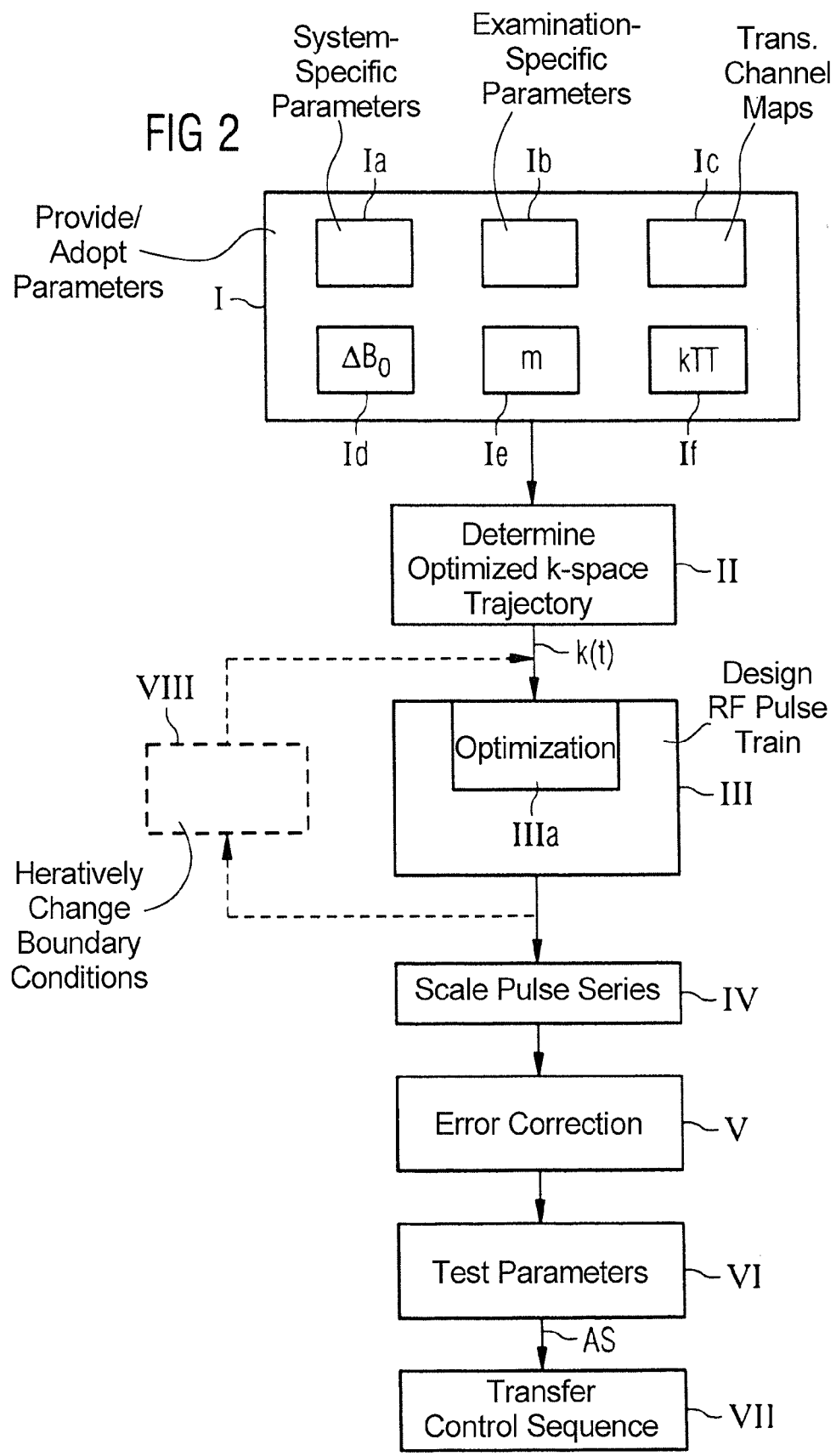
FIG. 2 is a flowchart for an exemplary embodiment of the method according to the invention for determination of a control sequence.

The workflow of a method according to the invention to determine a magnetic resonance system control sequence AS is explained in the following in a very simple example using the flowchart according to FIG. 2.

The different parameters used within the additional method are initially provided or, respectively, adopted in Step I. For example, system-specific parameters—such as the number of transmission channels, a maximum slew rate, a maximum gradient amplitude etc.—are adopted in Step Ia; different examination-specific parameters such as the positioning of the slices to be acquired etc. are adopted in Step Ib; and the $B_1$ maps for the individual transmission channels are adopted in Step Ic. Moreover, in Step Id a currently measured $B_0$ map $\Delta B_0$ can be provided which—as explained above—reflects the off-resonances caused by the inhomogeneities of the basic magnetic field, depending on the location. These inhomogeneities are also caused by the patient body, among other things, and can change given patient movements, for example. Moreover, a desired target magnetization m is provided in Step Ie. Finally, in Step If a k-space trajectory type kTT can optionally be predetermined, for example whether it is a straight-line EPI trajectory, a spiral trajectory, radial trajectory etc. This can also take place via the selected control protocol, since the trajectory frequently depends on the type of measurement. As mentioned, the optimal k-space trajectory type kTT can, however, also be determined automatically within the scope of the method. Apart from the fact that an exact k-space trajectory is always provided in conventional methods, the other inputs or, respectively, data acquisitions can take place as in conventional methods. The order of these method steps is arbitrary.

The optimized k-space trajectory k(t) is determined according to the invention in Step II. This method step is explained in more detail later in connection with FIG. 3.

The design of the radio-frequency pulse train—here a multichannel pulse train—then takes place automatically in Step III. The individual RF pulse trains are hereby developed for the different transmission channels, meaning that which RF pulse train must be sent on which channel is calculated precisely. This initially takes place for what is known as a "low flip range" with flip angles less than 5°, since the magnetization response proceeds linearly in this range. An iterative optimization method is hereby applied since this has turned out to be particularly suitable. Concretely, here what is known as the conjugate gradient method (CG method; from "conjugate gradient", or also "method of conjugated gradients"). However, in principle other optimization methods can also be used, even non-iterative optimization methods.

This can take place with arbitrary methods. In many previously known methods, the optimization method thereby takes place so that the quadratic mean deviation (least mean square) is minimized between the target magnetization and the real magnetization. This means that the following solution is sought:

$$\min(\|m_{real} - m\|^2) \tag{1}$$

wherein m is the target magnetization, and $m_{real} = A \cdot b(t)$ is the (theoretical) real magnetization achieved via the RF pulse train b(t), wherein A is what is known as the design matrix, consisting of a system of linear, complex equations into which enter the spatial coil profiles and the existing $B_0$ maps and $B_1$ maps, and the k-space trajectory that is used. This design matrix is described in, for example, W. Grissom et al.: "Spatial Domain Method for the Design of RF Pulses in Multicoil Parallel Excitation", Mag. Res. Med. 56, 620-629, 2006. b(t) is a vector that, for example, includes the N functions $b_c(t)$ (a function for each transmission channel c=1 through N). for example, this equation is arranged in Step IIIa. If the solution to Equation (1) is found, a function of the amplitude depending on the time exists as a result for all present transmission channels. However, both the setup of this equation and various solution possibilities are known to those skilled in the art and do not need to be explained in detail here. Optionally, an optimized solution can also take place using an iterative method, for example in that boundary conditions to be complied with are changed in the solution of the equation in Step VIII in order to achieve an additional optimization of the radio-frequency exposure for the patient.

A multichannel pulse series and a k-space trajectory that are acquired for the low flip range exist at the end of the optimization 111a in Step III. The multichannel pulse series can then be scaled up in Step IV in order to achieve the actual desired target magnetization, which normally is not situated in a flip angle region of 5° but rather goes up to a 90° flip angle. This takes place simply via multiplication of the amplitudes of the individual pulses with the desired scaling factor.

In Step V the error that can occur upon scaling up is corrected via a partial Bloch simulation. Such a partial Bloch simulation is implemented only at individual points in time within the pulse series. Using the Bloch equations, the data for the respective point in time for which the check should take place are hereby tested in a simulator with application of the Bloch equations, and the achieved magnetization is thus calculated. Deviations from the specifications of the target magnetization can then be detected, and smaller corrections can accordingly be made by changing the radio-frequency pulse series.

The test of all found parameters then subsequently takes place in Step VI via a temporally complete Bloch simulation. In this it is checked whether the magnetization that is achieved with the parameters actually corresponds to the target magnetization.

In conclusion, in Step VII the control sequence AS is transferred for caching or immediate execution.

Figure 3:
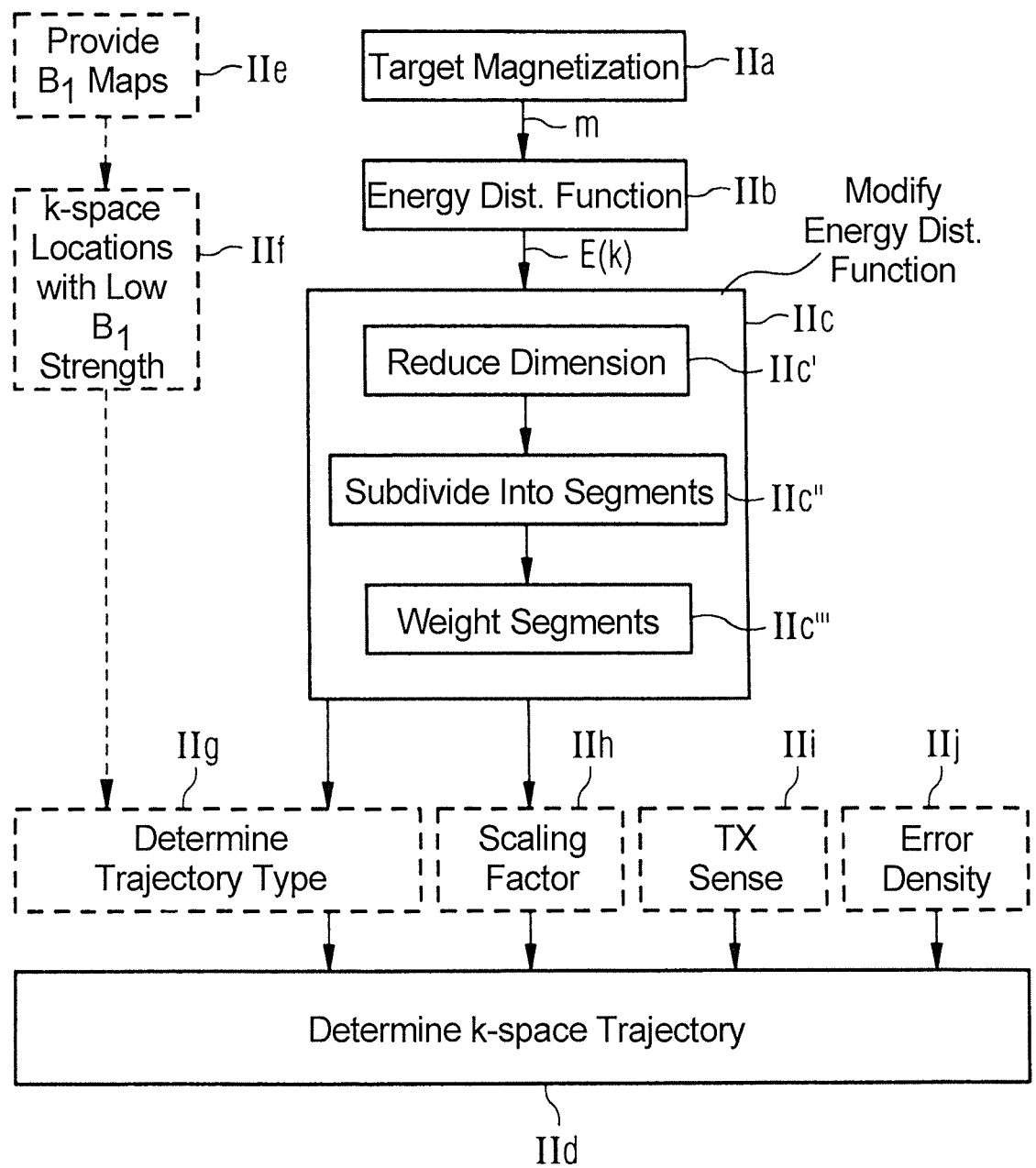
FIG. 3 is a flowchart for an exemplary embodiment of the method according to the invention for determination of a k-space trajectory within the scope of the method according to FIG. 2.

Step II—in which the k-space trajectory k(t) is determined in the manner according to the invention—is shown in somewhat more detail in FIG. 3 in the form of multiple sub-steps.

Figure 4:
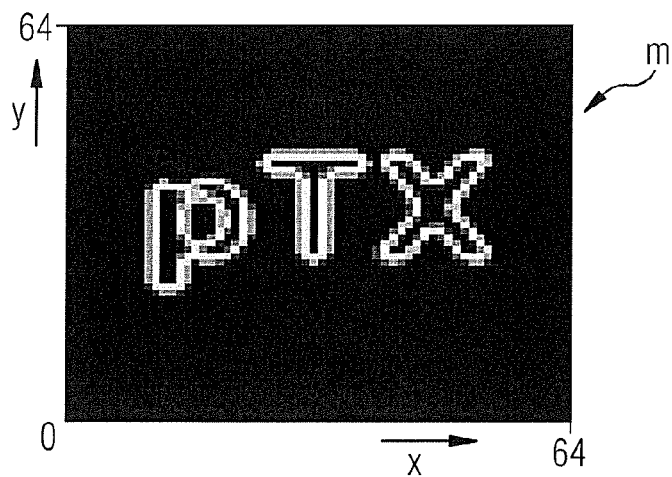
FIG. 4 shows an example of a target magnetization in a two-dimensional slice in positional space.

The acceptance of the target magnetization m which was detected in Step Ie is initially shown in Step IIa. FIG. 4 shows as an example a pattern with the lettering pTX as a target magnetization within a two-dimensional slice in positional space with the Cartesian coordinates x, y (with 64×64 pixels≈220×220 mm).

Figure 5:
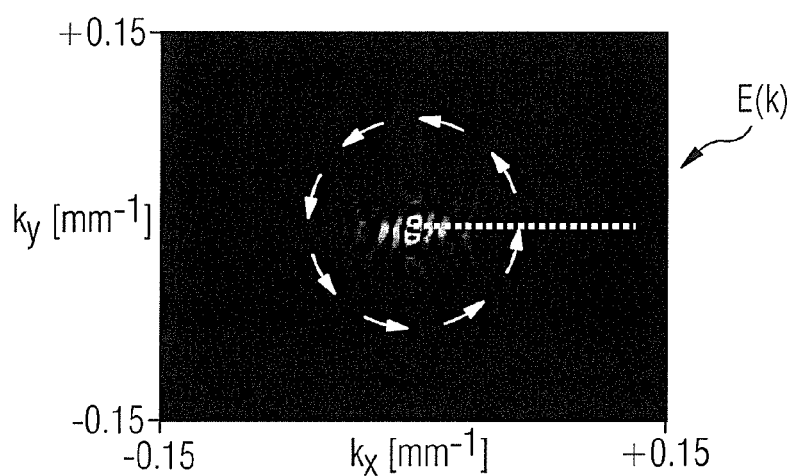
FIG. 5 shows an example of an energy distribution function in Cartesian coordinates in k-space based on the target magnetization according to FIG. 4.

In Step IIb this target magnetization is then converted by means of a Fourier transformation (advantageously a two-dimensional fast Fourier transformation) into two-dimensional k-space in order to obtain an energy distribution function E(k). However, before the Fourier transformation the target magnetization m was mean-exempted in order to better detect radio-frequency details, since a masking of the k-space center with the (normally very high) peak can be achieved via the mean-exemption. This determination of the energy distribution function E(k) from the target magnetization m(r) can be written mathematically as follows $$E(k)=|FT(m(r)-m_{mean})|=|\int(m(r)-m_{mean})e^{-ikr}dr| \quad (2)$$

wherein r is the position in positional space; k is the position in k-space; and $m_{mean}$ is the mean value of the target magnetization m(r) in positional space. The result of this Fourier transformation of the target magnetization from FIG. 4 is shown in FIG. 5. Shown here is a two-dimensional slice in k-space with the Cartesian coordinates $k_x$, $k_y$ in [$mm^{-1}$].

Figure 6:
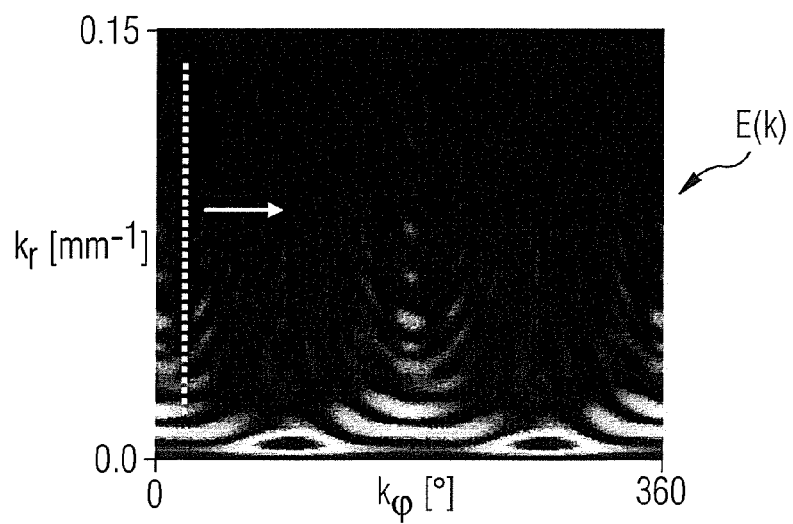
FIG. 6 shows the energy distribution function according to FIG. 5 after a transformation in polar coordinates in k-space.

A suitable modification of the energy distribution function E(k) then takes place in Step IIc. For this the dimension of the energy distribution function E(k) in k-space is initially reduced in a first step IIc'. In the exemplary embodiment shown in FIG. 5, this can take place via a transformation of the energy distribution function in polar coordinates $k_r$, $k_\phi$. This presentation is shown in FIG. 6, wherein the angle $k_\phi$ is shown in [°] on the abscissa and the radius $k_r$ is shown in [$mm^{-1}$] on the ordinate. The lowermost line in FIG. 6 thereby corresponds to the k-space center in FIG. 5. In order to then reduce the energy distribution function represented in polar coordinates $k_r$, $k_\phi$ to one n-dimensional (here to the radius $k_r$), a maximum projection with regard to the radius $k_r$ takes place after the polar coordinate transformation. For this, for each radius $k_r$ the maximum is respectively sought in the direction of the angle $k_\phi$ (as represented by the arrow in FIG. 6) or—in other words—the maximum for each radius $k_r$ is projected on a line indicated by the points in FIG. 6. This corresponds to a projection of the maximum for a radius $k_r$ on the dotted line shown in FIG. 5 when this line rotates once around the center in the arrow direction.

Figure 7:
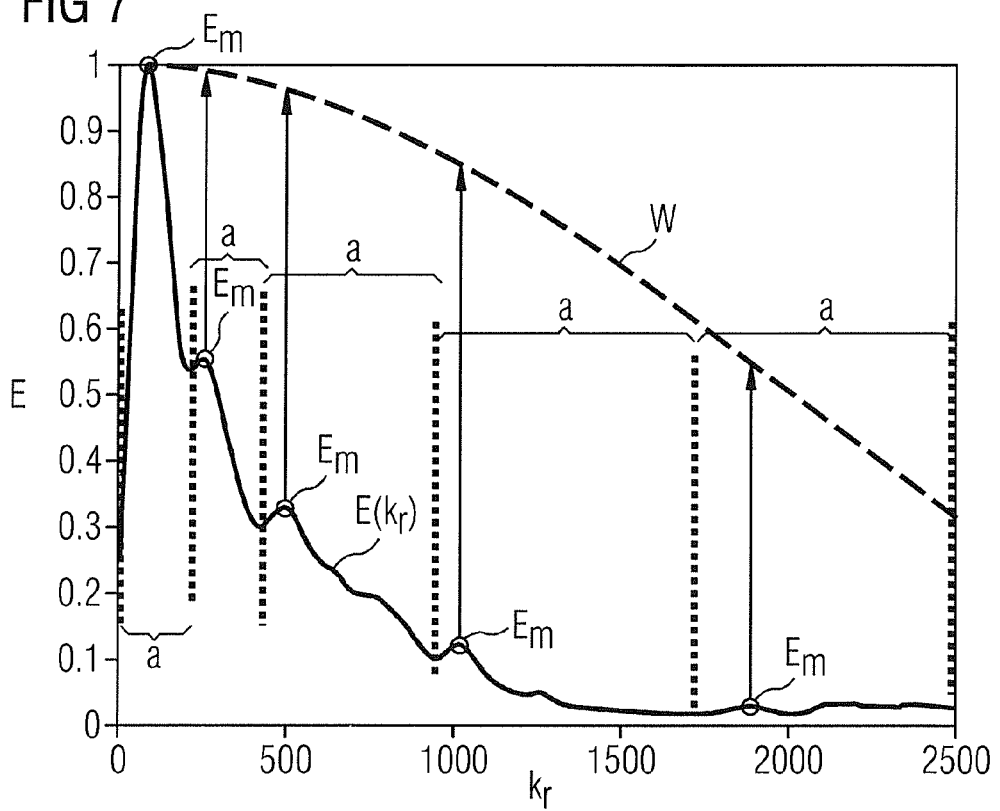
FIG. 7 shows an energy distribution function reduced to one dimension according to FIG. 6, with segmentation lines.

As a result, a modified "radial" energy distribution function $E(k_r)$ as it is shown in FIG. 7 is obtained in the exemplary embodiment presented in FIGS. 5 and 6. Here the maximum of the energy distribution function E(k) is respectively plotted for each radius $k_r$ (specified in sample points (samples)), wherein the sample point 2500 corresponds to the value 0.15 $mm^{-1}$. The energy E is the relative energy normalized to the maximum value 1. In this Figure it is also clearly shown that the energy is 0 at the radius $k_r$=0, which is to be ascribed to the mean-exemption of the original target magnetization. Otherwise, a very high peak would be here that would project beyond all other structures within the energy distribution function so that these would no longer have an effect.

In a further step IIc", this modified radial energy density distribution $E(k_r)$ is now subdivided into individual spatial segments a or, respectively, segments. In the exemplary embodiment shown in FIG. 7, this division only takes place with regard to the radius $k_r$, i.e. in one dimension. However, in principle it would also be possible to subdivide an energy distribution function in two or three coordinates into respective spatial segments or, respectively, two or three-dimensional segments, for example if no dimension reduction had previously been implemented.

Independent of whether a dimension reduction had previously been implemented—whether there are polar coordinates, Cartesian coordinates or other coordinates—such a segmentation of the energy distribution function can advantageously take place in k-space. The segmentation is thereby particularly preferably implemented so that the maxima of the energy distribution function are initially sought and the energy distribution function is then divided up such that a maximum is to be found at each spatial segment a. FIG. 7 shows the maximum values $E_m$ of the energy distribution function $E(k_r)$. The precise division of the spatial segments takes place so that the limits (that are represented by the dotted vertical lines in FIG. 7) at the points of the minima of the energy distribution function $E(k_r)$ are placed between two respective maxima $E_m$.

The segmentation takes place in order to now weight the individual segments differently in Step IIc'''. This is implemented in order to ensure that the low energy maxima are not too severely underrepresented. Namely, it is typically the case that the high frequencies in k-space tend to be avoided in most methods, which leads however to a resolution reduction in the later images. A compromise between the energy consumption and a good resolution can be found through the individual weighting of the individual spatial segments of the energy distribution function.

The weighting can thereby preferably take place so that the function $E_m$ is multiplied with a scaling value at the coordinates (i.e. concretely the radius $k_r$ in the exemplary embodiment shown in FIG. 7) at which the appertaining spatial segments a respectively have their maximum value $E_m$, such that it reaches the value of a weighting function W. For example, this can likewise be normalized to 1 at its maximum. This is indicated in FIG. 7 using the arrows that point upward from the energy maxima to the weighting function W. All additional function values within the appertaining spatial segment a are then scaled with the same scaling factor as the associated maximum $E_m$. This means that that the entire function in the appertaining spatial segment a is raised so far that the maximum value $E_m$ reaches the value of the weighting function W.

Figure 8:
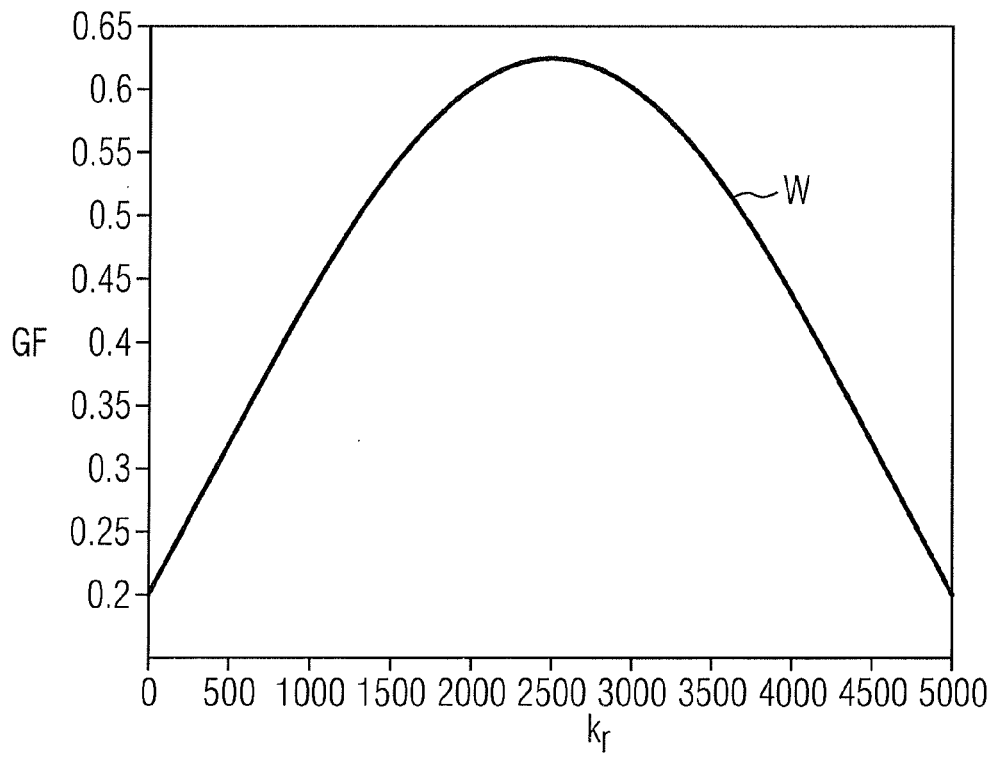
FIG. 8 shows an example of a weighting function for weighting of the energy distribution function.

For example, a Hanning window function, a Gaussian function, a Hemming function etc. can be used as a weighting function. The preferred Hanning function is shown in FIG. 8, wherein here the weighting factor GF is shown in relative units in k-space (normalized to the maximum value 1) over the radius $k_r$ (specified again at sample points (samples), wherein here the sample point 0 corresponds to the value $-0.15$ mm$^{-1}$ and the sample point 5000 corresponds to the value $0.15$ mm$^{-1}$). For the weighting, only the right half of the function from 2500 to 5000 is used, matching to the positions 0 through 2500 in FIG. 7.

Since the individual spatial segments a of the function $E(k_r)$ are increased differentially, a smoothing at the boundaries between the spatial segments is now required, which can take place via a moving average method or via a different low-pass filter. Since the boundaries between the spatial segments were selected at the minima of the function $E(k_r)$, here the modification of the function via the smoothing is not as relevant for the subsequent trajectory determination since the matching, optimal k-space trajectory later is not very dense anyway (in relation to the maximum points of the energy distribution function) at the points with the minima of the energy distribution function.

Figure 9:
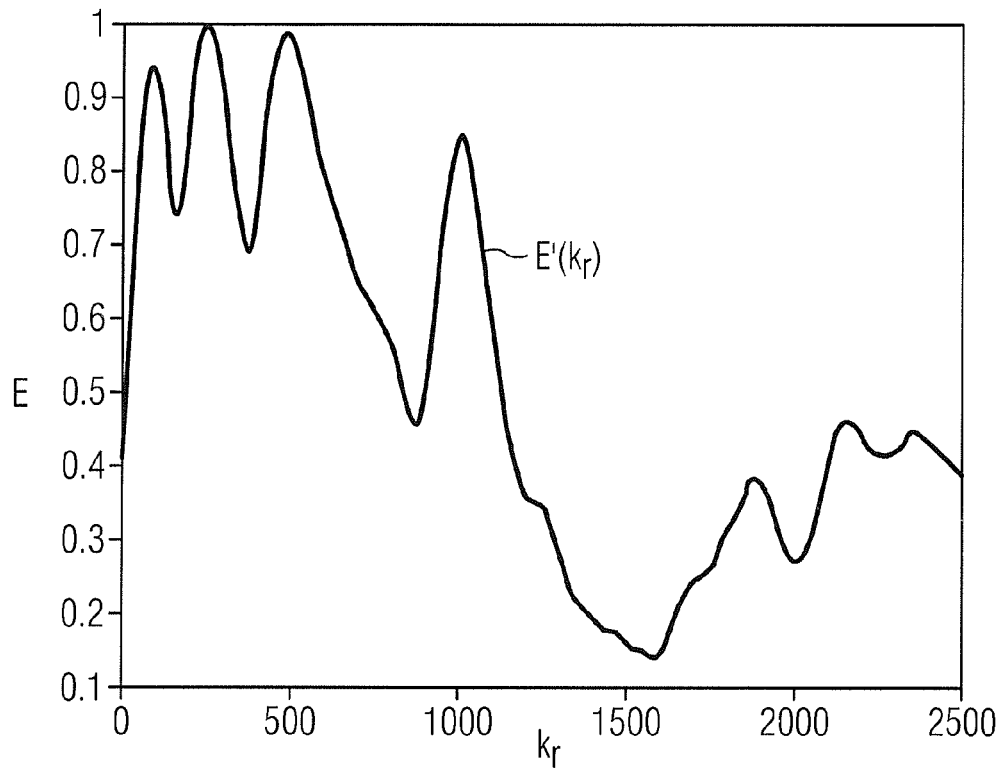
FIG. 9 shows the energy distribution function according to FIG. 7, weighted segment-by-segment with the weighting function according to FIG. 8.

After the scaling (represented using FIGS. 7 and 8) and after the smoothing, the modified energy distribution function $E'(k_r)$ shown in FIG. 9 then results from the radial energy distribution function $E(k_r)$ shown in FIG. 7. The relative energy E, normalized to the value 1 at maximum, is again plotted over the radius $k_r$ (indicated at sample points as in FIG. 7). Here it is clearly apparent that this weighted, radial energy distribution function $E'(k_r)$ again has the same maximum values $E_m$ as the radial energy distribution function $E(k_r)$ in FIG. 7, but with somewhat adapted levels, meaning that the maxima at larger radii were increased relative to the maxima at the smaller radii.

The matching k-space trajectory can then finally be determined in Step IId on the basis of the modified energy distribution function $E'(k_r)$ that is determined in such a manner, such that the density of the k-space trajectory is optimally high in the range of the high energies and is optimally low at the ranges with low energy in the energy distribution function.

Optionally, a particularly suitable trajectory type kTT can initially be determined automatically beforehand on the basis of the energy distribution function $E'(k_r)$. The determination of the trajectory in Step IId then takes place for the trajectory type determined in Step IIg. Alternatively, however, this trajectory type can be provided by the operator at the beginning of the method, for example in Step If in FIG. 2.

Figure 10:
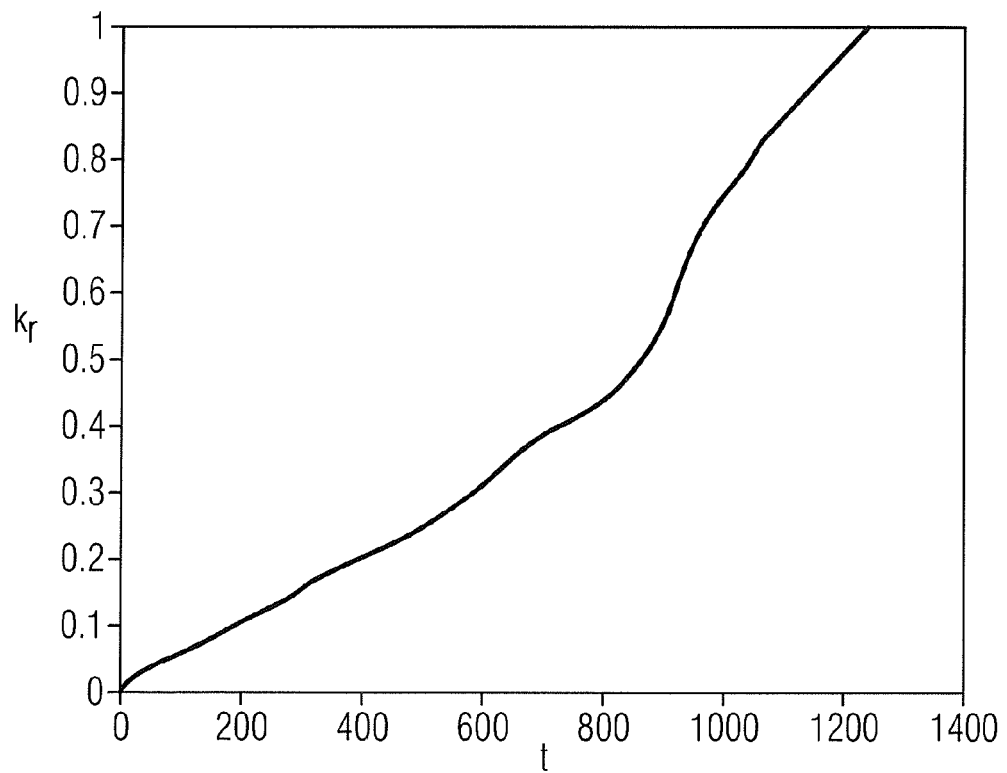
FIG. 10 shows a curve of the radius of a spiral-shaped k-space trajectory depending on time, under consideration of the energy distribution function according to FIG. 9.

FIG. 10 is a diagram in which the radius $k_r$ of a spiral trajectory in k-space is shown normalized in relative units to the maximum value of 1 over time t (specified again at sample points (samples), wherein the sample point 1400 corresponds approximately to the value of 10 ms since the maximum of 1 is achieved at 9.7 ms). As is apparent in this diagram, a relatively slow rise is initially present in the first range up to 600 samples, meaning that the density of the trajectory is relatively high in this range (in a radius of up to 0.4). In the range as of 800 to 1000 samples, the radius $k_r$ then increases fairly rapidly; this is hereby an undersampled range that is accordingly correlated with the minimum between 1200 and 1700 samples in FIG. 9. This means that the range in which the distinctive minimum is located is undersampled.

Optionally, additional method steps (that are represented by the dashed-line boxes in FIG. 3) can be used to locate the optimal k-space trajectory.

For example, current $B_1$ maps for the individual transmission channels or, respectively, antennas are adopted in Step IIe. For example, these $B_1$ maps can have been determined in Step Ic for every single transmission channel. In Step IIf, locations in k-space at which the $B_1$ strength is relatively low can then optionally be determined on the basis of these $B_1$ maps. These can then likewise be taken into account in Step IIg when a decision is made about the suitable k-space trajectory type ktt. Otherwise, this information can also directly influence the determination of the suitable k-space trajectory in Step IId. An additional optional Step is the specification of a scaling factor in Step IIh which affects the spatial resolution of the excitation. The slope of a linear, systematic energy density gradient is hereby provided, for example added to the energy distribution function as an additional function part so that an increased spatial resolution is enabled at the cost of increased radio-frequency power, for example.

Furthermore, a TX sense method can optionally, additionally (as shown in Step IIi) be used in order to vary the density of the sample points along the k-space trajectory and thus to accelerate the method. It is likewise possible to also determine an error density in k-space on the basis of a current $B_0$ map, and possibly additionally on the basis of the target magnetization m, and to likewise take these into account in the calculation of the current, optimal k-space trajectory. This is indicated in an optional Step IIj in FIG. 3.

Figure 11:
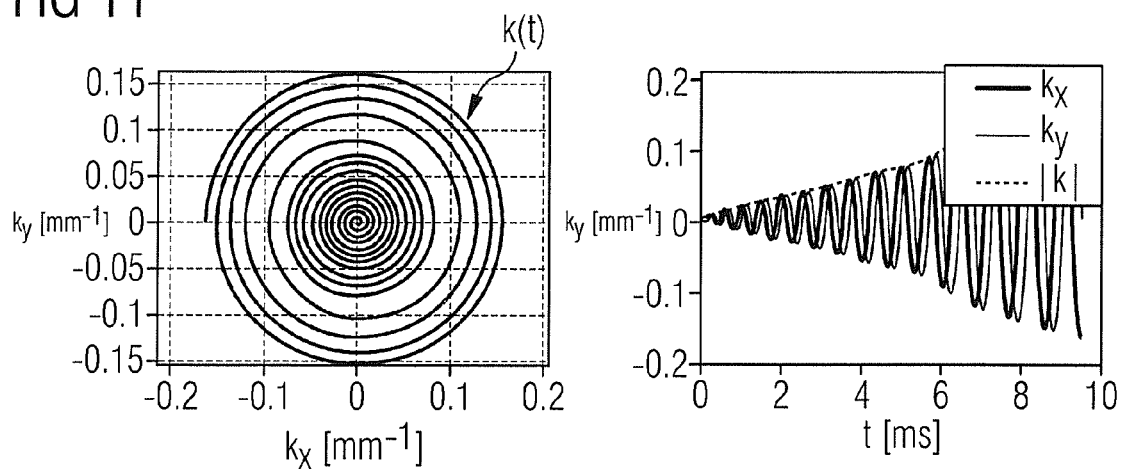
FIG. 11 shows various spiral-shaped k-space trajectories created under consideration of the radial curve according to FIG. 9.

FIG. 11 shows on the left side a two-dimensional, spiral-shaped k-space trajectory k(t) (represented in the Cartesian k-space coordinates $k_x$, $k_y$, respectively in units mm$^{-1}$) corresponding to the chronological slope curve in FIG. 10. The curve progressions for the x-coordinate $k_x$, the y-coordinate $k_y$ and the spatial amplitude k (in mm$^{-1}$) over time t (in ms) are accordingly shown on the right side in the graphic. This spiral trajectory k(t) clearly shows that the density of the spiral-shaped line is initially greater in k-space, then initially decreases outward and finally increases again towards the end, as this is also provided according to FIGS. 9 and 10.

Figure 12:
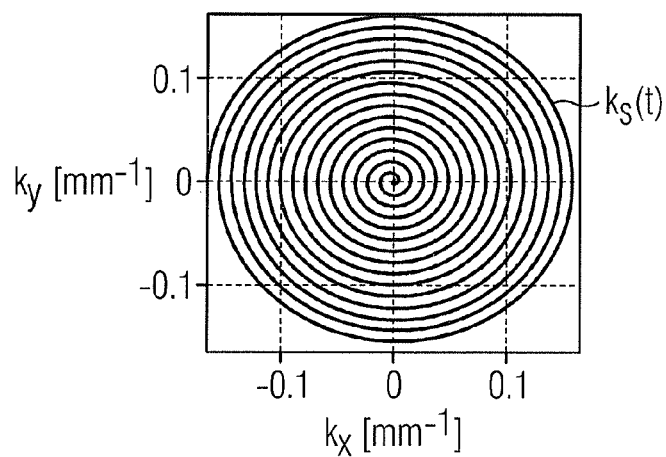
FIG. 12 shows a typical, spiral-shaped k-space trajectory with uniform slope according to the prior art.
Figure 13:
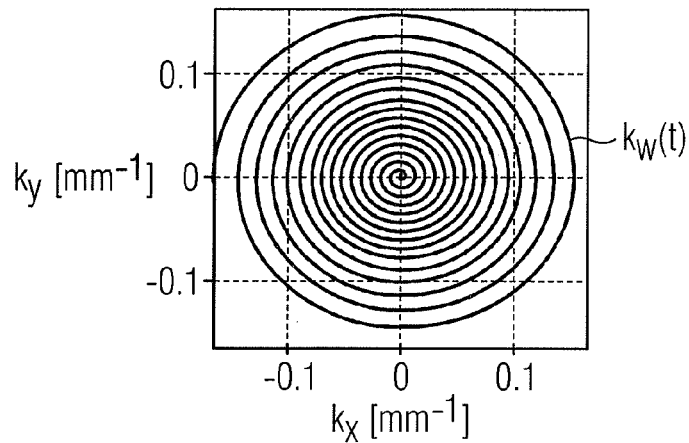
FIG. 13 shows a spiral-shaped k-space trajectory as in FIG. 12, with a slope which was generated via weighting with a Hanning window function.

A conventional, two-dimensional k-space trajectory k-space(t) with uniform slope is shown for comparison in FIG. 12. FIG. 13 shows as further comparison a two-dimensional k-space trajectory $k_w(t)$ similar to as in FIG. 12, wherein the radial density of the trajectory $k_w(t)$ was, however, previously weighted with a Hanning window, meaning that the density of the tracks continuously decreases moving outward. An adaptation to the target magnetization hereby does not take place. It is merely sought to sample somewhat more densely in the k-space center and somewhat less densely moving outward in order to save energy at the cost of resolution.

Figure 14:
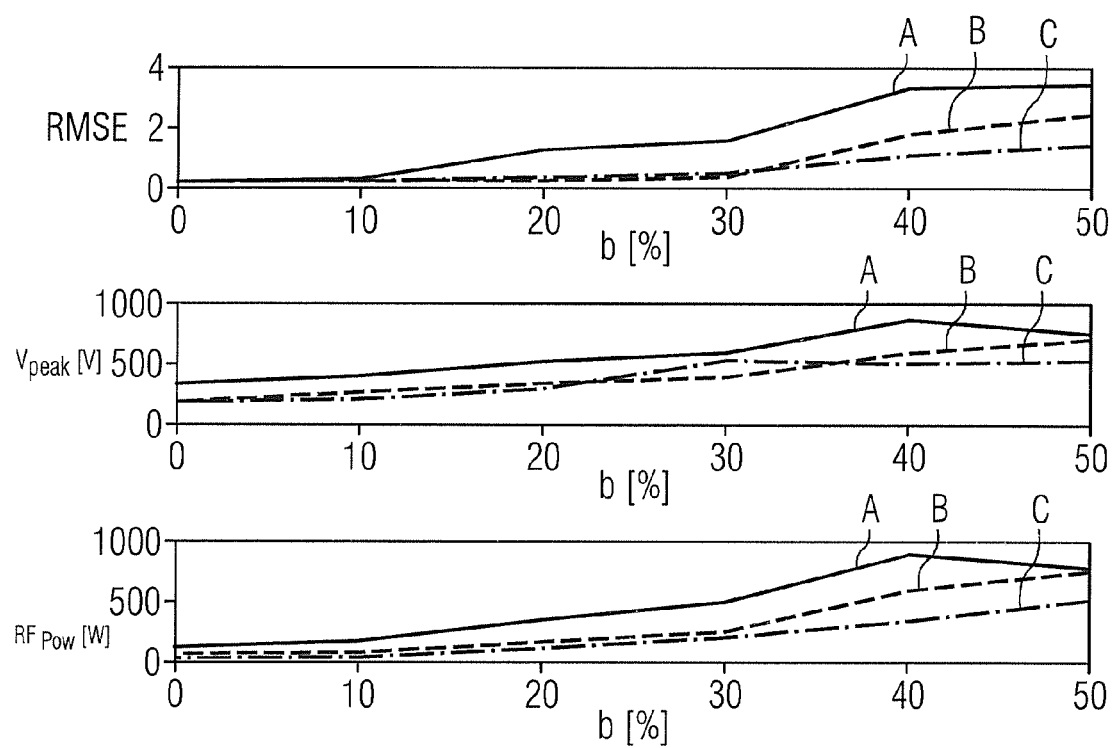
FIG. 14 shows various performance parameters of the spiral-shaped k-space trajectories according to FIGS. 11, 12 and 13 in comparison.

For comparison, the graphics in FIG. 14 show various performance parameters as they were achieved in Bloch simulations, wherein these various measurements respectively differ in the type of k-space trajectory that is used. The target magnetization corresponded to the image in FIG. 4 in all measurements. The maximum target flip angle was set to 20°. Off-resonances—i.e. a $B_0$ map—were not taken into account. A two-dimensional spiral trajectory with a length of around 10 ms and with 15 spiral orbits was respectively used. This means that here the trajectory type was precisely predetermined, and the optimal trajectory type was not determined by the system itself. $B_1$ maps acquired at a phantom were taken into account, wherein the same phantom was always used. A tick-tock optimization method with a magnitude least square target function was then used on the basis of the predetermined trajectory, for example as it is described in the cited article by Setsompop et al. A regularization (for example a Tikhonov regularization) that was used. Measurement was thereby made with different acceleration factors up to 50%.

In all three diagrams, the curve A is a curve that was simulated with a conventional, two-dimensional k-space trajectory as in FIG. 12. The curve B corresponds to a conventional, two-dimensional k-space trajectory $k_w(t)$—weighted with a Hanning window—as it is shown in FIG. 13, and the curve C corresponds to the two-dimensional k-space trajectory k(t) determined according to the invention as it is shown in FIG. 11. In all three diagrams in FIG. 14, the acceleration factor b is respectively plotted in % on the x-axis. 50% here means that 50% of the rounds on the k-space trajectory were saved. This means that here the percentile undersampling of the spirals is plotted.

The uppermost diagram shows the root mean square error, i.e. the excitation error RMSE (a dimensionless value). It clearly shows that, given a high acceleration of more than 30%, the method according to the invention offers significant advantages relative to the classical two-dimensional k-space trajectories since the excitation error is significantly lower. The middle diagram shows the maximum peak voltage $V_{peak}$ of the RF pulse (in volts). Here the simulation values of the two-dimensional k-space trajectories generated with the method according to the invention are always better situated than those generated with a classical, invariant k-space trajectory. Given particularly high acceleration factors, the method according to the invention is also advantageous relative to a simple weighting with a Hanning window.

Finally, the lowermost diagram shows the radio-frequency power $RF_{pow}$ (in watts) that is introduced in total. This is an indicator for the introduced SAR. It is clearly shown that, independent of the acceleration, a simulation with a two-dimensional k-space trajectory that is determined according to the invention is always better than a method with a classical two-dimensional k-space spiral trajectory or a trajectory generated from this, weighted with a Hanning window, wherein the trajectory that was weighted with the Hanning window is still better than the classical trajectory.

Figure 15:
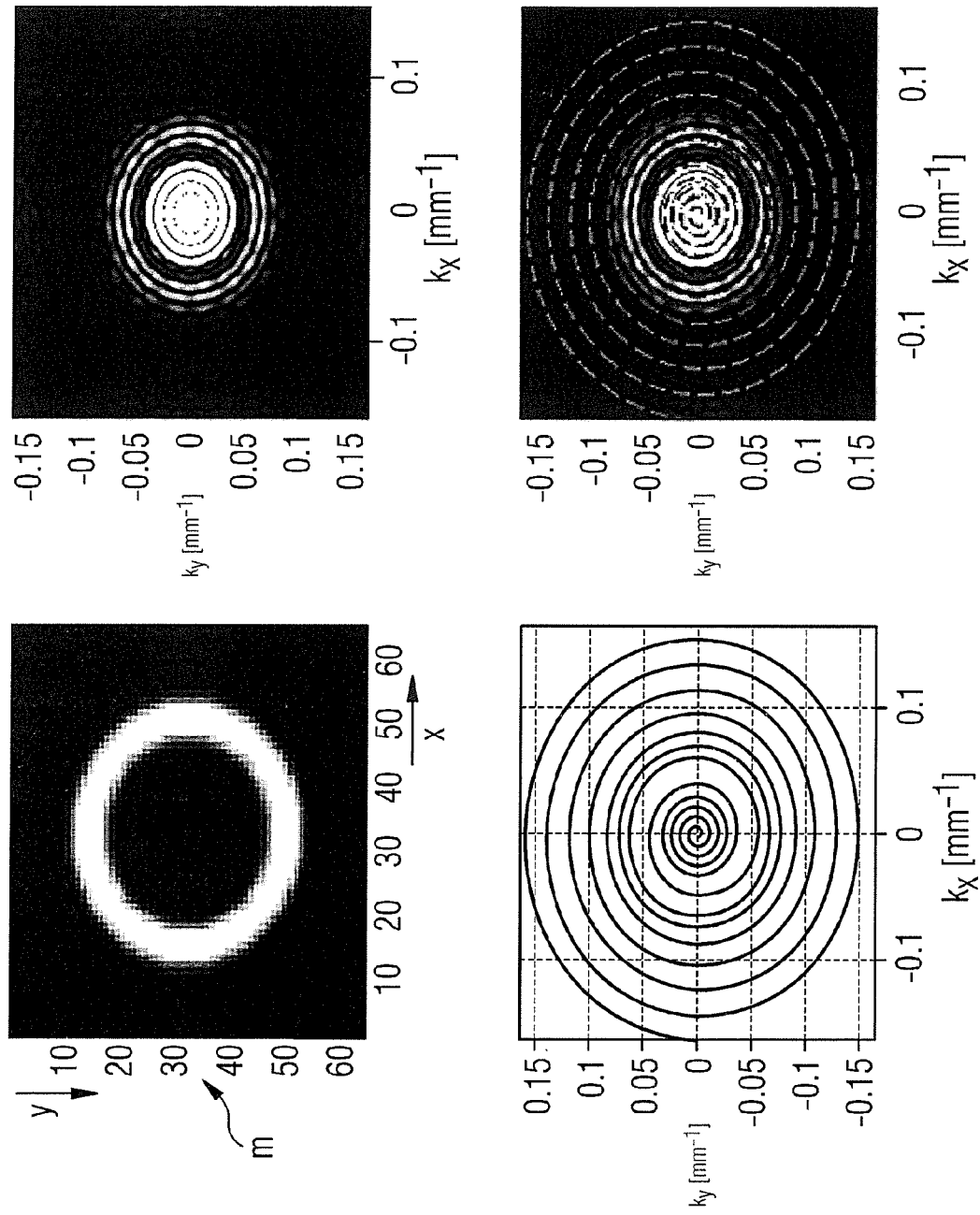
FIG. 15 is an additional example of a target magnetization in a two-dimensional slice in position space (top left); an energy distribution function created from this in Cartesian coordinates in k-space (top right); a spiral-shaped k-space trajectory (lower left) that is optimized for this; and a superposition of the k-space trajectory with the energy distribution function (lower right).

FIG. 15 again shows four images with regard to a method as was previously shown for a spiral trajectory, wherein here a different pattern of the target magnetization m is assumed. The image to the left shows a target magnetization pattern in the form of an annular circle in a slice or x/y-plane in positional space. In addition to this, the image to the right shows the associated energy distribution function in k-space in the Cartesian k-space coordinates $k_x$, $k_y$ (it is a high contrast image, so that the frequencies can also be detected well). In the image at the lower left, the optimal two-dimensional, spiral-shaped k-space trajectory kt determined on the basis of this energy distribution function is shown, and the image shown to the lower right shows a superposition of the energy distribution function with this spiral-shaped k-space trajectory that here is shown in dashed white lines on a black background or is shown in black on a white background. It clearly shows that the density of the trajectories is accordingly high in the regions with a high energy density (i.e. the white regions in k-space), in contrast to which the density of the k-space trajectory correspondingly decreases in the regions with lower energy density.

Figure 16:
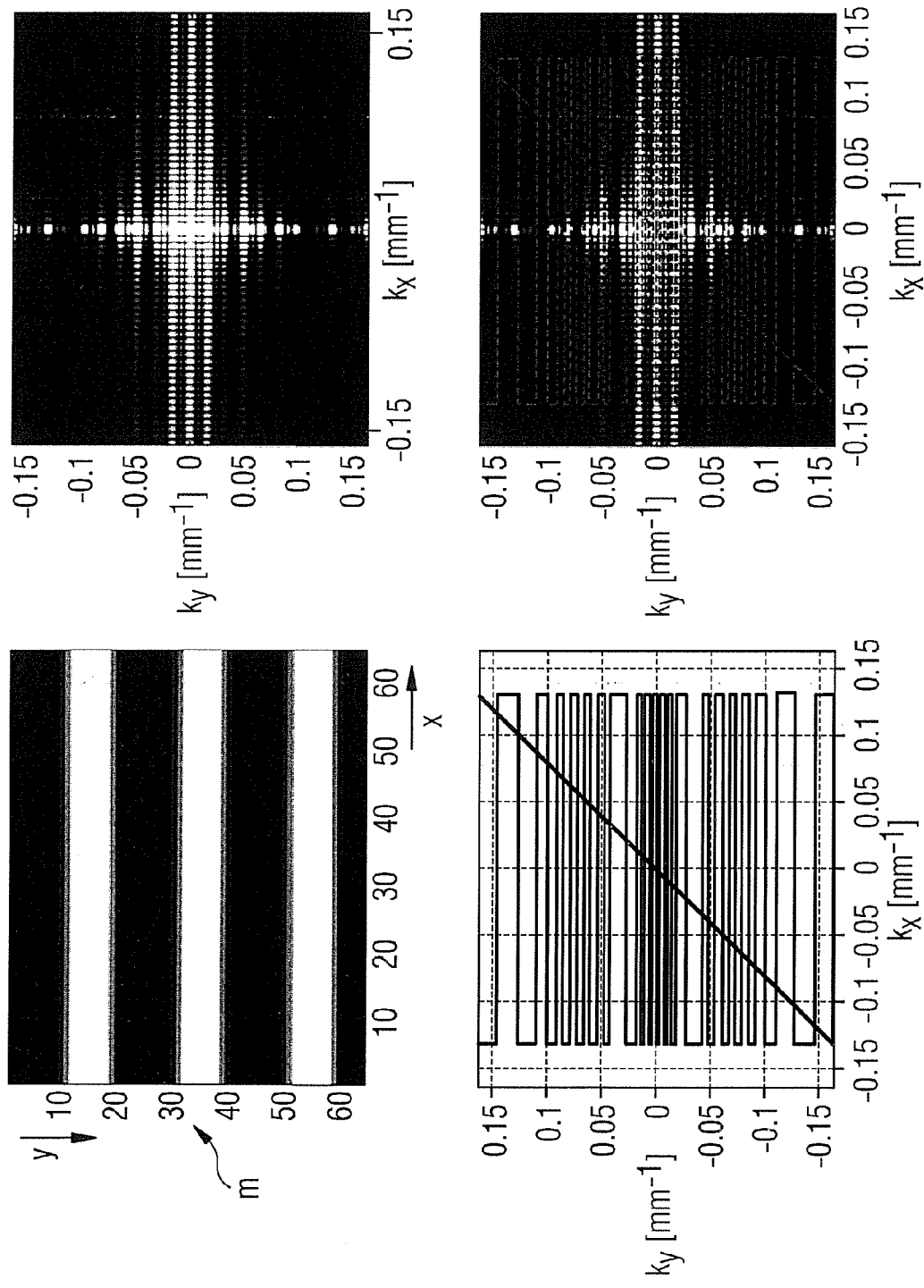
FIG. 16 is an additional example of a target magnetization in a two-dimensional slice in a two-dimensional slice in positional space (top left); an energy distribution function created from this in Cartesian coordinates in k-space (top right); an EPI k-space trajectory optimized for this (lower left); and a superposition of the k-space trajectory with the energy distribution function (lower right).

FIG. 16 shows similar images for a stripe-shaped target magnetization pattern in a slice in an x/y-plane in positional space. Given a calculation of the energy distribution function in k-space by means of a Fourier transformation, the pattern in k-space that is shown in the upper right image is obtained. A two-dimensional EPI k-space trajectory determined from this energy distribution function is shown to the lower left in the diagram. In the image to the lower right, the superposition of the optimized k-space trajectory with the image of the energy distribution function is again shown at the top right. Here as well it is shown that the highest density of k-space trajectory lines is to be found where the energy distribution function also has the highest values, i.e. where the energy density in k-space is particularly high.

Figure 17:
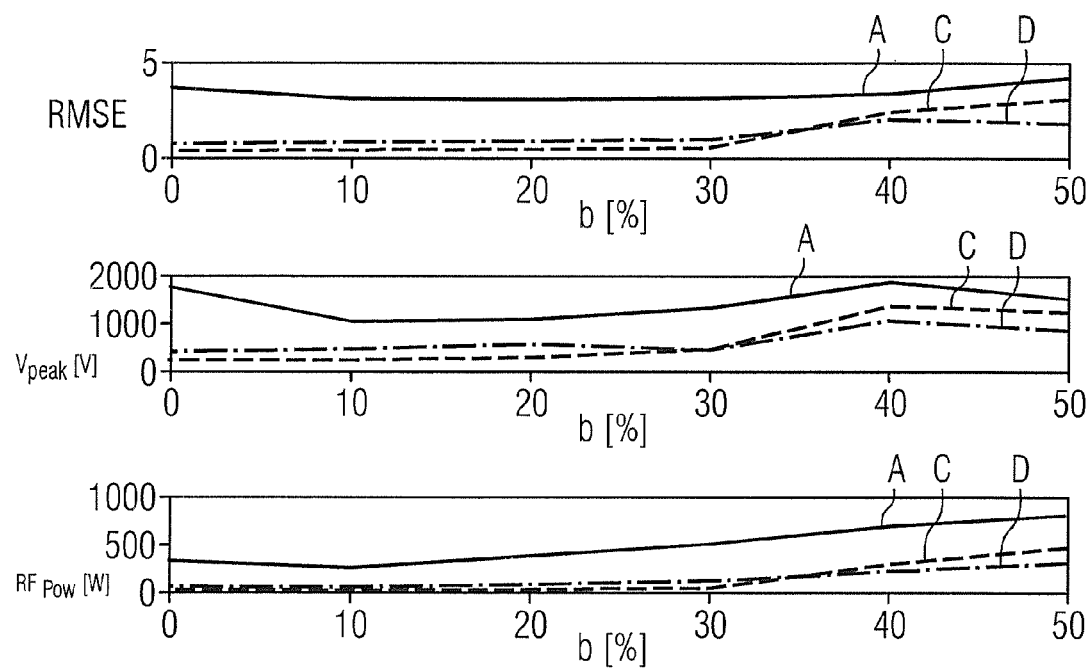
FIG. 17 shows various performance parameters as in FIG. 14 for various EPI k-space trajectories in comparison.

Finally, FIG. 17 again shows performance parameter values analogous to the evaluation in FIG. 14, but this time for an EPI trajectory similar to as it is shown to the lower left in FIG. 16. Apart from the fact that it is now an EPI trajectory with 41 lines and not a spiral-shaped trajectory, the input values for the simulation were identical to that of FIG. 14. The target pattern is also as in FIG. 14. Shown again in the uppermost diagram is the root mean square error (i.e. the excitation error); the maximum peak voltage is shown in the middle diagram; and the actual radiated radio-frequency power is shown in the lower diagram, respectively dependent on the acceleration factor b in %. The curve A shows the values with a classical EPI trajectory with equidistant intervals as it is conventionally used. The curve C shows the simulation values given use of a k-space trajectory which was varied with regard to the density in one dimension in the manner according to the invention (analogous to the lower left image in FIG. 16), and curve D shows the simulation values for an EPI trajectory whose density was varied according to the invention in two dimensions (i.e. without reduction of the dimension as described above). It is clearly apparent that, in all cases, the better simulation values are achieved with the method according to the invention relative to a conventional trajectory. Only given high acceleration values is the variation of the density in two dimensions better than the variation in only one dimension. In most cases, the faster method is therefore sufficient with a dimension reduction.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method control sequence for operating a magnetic resonance system, comprising:
   operating a magnetic resonance data acquisition unit to detect a target magnetization in an examination subject in the magnetic resonance data acquisition unit;
   in a processor, automatically determining an energy distribution function in k-space based on the detected target magnetization;
   in said processor, determining a k-space trajectory in k-space from said energy distribution function in k-space;
   in said processor, implementing a radio-frequency pulse optimization algorithm to determine a radio-frequency pulse train for said k-space trajectory; and
   making said radio-frequency pulse train available from an output of said processor in an electronic form usable by a sequence controller of said magnetic resonance data acquisition unit to operate said magnetic resonance data acquisition unit to emit radio-frequency pulses according to said radio-frequency pulse train to acquire magnetic resonance data from said examination subject.

2. A method as claimed in claim 1 comprising Fourier transforming said target magnetization to determine said energy distribution function.

3. A method as claimed in claim 1 comprising mean-exempting said target magnetization to determine said energy distribution function.

4. A method as claimed in claim 1 comprising modifying said energy distribution function in k-space in said processor, and determining said k-space trajectory based on the modified energy distribution function.

5. A method as claimed in claim 4 comprising modifying said energy distribution function in k-space by segmenting said energy distribution function in k-space into spatial segments and respectively differently modifying the individual spatial segments.

6. A method as claimed in claim 5 comprising segmenting said energy distribution function based on an extreme value of said energy distribution function.

7. A method as claimed in claim 4 comprising modifying said energy distribution function by scaling said energy distribution function with a weighting function.

8. A method as claimed in claim 4 comprising modifying said energy distribution function in k-space by segmenting said energy distribution function in k-space into spatial segments and respectively differently modifying the individual spatial segments and differently weighting the individual spatial segments with respective values of said weighting function associated with the respective individual spatial segments.

9. A method as claimed in claim 4 comprising modifying said energy distribution function in k-space by reducing a dimension of said energy distribution function in k-space.

10. A method as claimed in claim 1 comprising, in said processor, detecting at least one $B_0$ map in said processor, and calculating an error density function in k-space by implementing an analytical function based on at least one of said $B_0$ map and said target magnetization, and determining said k-space trajectory from said error density.

11. A method as claimed in claim 1 comprising operating said magnetic resonance data acquisition unit with said radio-frequency pulse train from said sequence controller.

12. A control sequence device for operating a magnetic resonance system, comprising:
- a processor having an input provided with data acquired by a magnetic resonance data acquisition unit representing a target magnetization in an examination subject in the magnetic resonance data acquisition unit;
- said processor being configured to automatically determine an energy distribution function in k-space based on the detected target magnetization;
- said processor being configured to determine a k-space trajectory in k-space from said energy distribution function in k-space;
- said processor being configured to implement a radio-frequency pulse optimization algorithm to determine a radio-frequency pulse train for said k-space trajectory; and
- said processor having an output at which said radio-frequency pulse train is available in an electronic form usable by a sequence controller of said magnetic resonance data acquisition unit to operate said magnetic resonance data acquisition unit to emit radio-frequency pulses according to said radio-frequency pulse train to acquire magnetic resonance data from said examination subject.

13. A magnetic resonance system comprising:
- a magnetic resonance data acquisition unit comprising at least one RF antenna;
- a control device configured to operate said magnetic resonance data acquisition unit to detect a target magnetization in an examination subject in the magnetic resonance data acquisition unit;
- a processor configured to automatically determine an energy distribution function in k-space based on the detected target magnetization;
- said processor being configured to determine a k-space trajectory in k-space from said energy distribution function in k-space;
- said processor configured to implement a radio-frequency pulse optimization algorithm to determine a radio-frequency pulse train for said k-space trajectory; and
- said processor being configured to make said radio-frequency pulse train available from an output of said processor in an electronic form usable by a sequence controller of said magnetic resonance data acquisition unit to operate said magnetic resonance data acquisition unit to emit radio-frequency pulses according to said radio-frequency pulse train to acquire magnetic resonance data from said examination subject.

14. A non-transitory, computer-readable data storage medium encoded with programming instructions, said data storage medium being loaded into a computerized control sequence determination device for use with a magnetic resonance system comprising a magnetic resonance data acquisition unit, said programming instructions causing said control sequence determination device to:
- operate a magnetic resonance data acquisition unit to detect a target magnetization in an examination subject in the magnetic resonance data acquisition unit;
- determine an energy distribution function in k-space based on the detected target magnetization;
- determine a k-space trajectory in k-space from said energy distribution function in k-space;
- implement a radio-frequency pulse optimization algorithm to determine a radio-frequency pulse train for said k-space trajectory; and
- make said radio-frequency pulse train available from an output of said processor in an electronic form usable by a sequence controller of said magnetic resonance data acquisition unit to operate said magnetic resonance data acquisition unit to emit radio-frequency pulses according to said radio-frequency pulse train to acquire magnetic resonance data from said examination subject.

* * * * *